(12) United States Patent
Kirby et al.

(10) Patent No.: US 7,528,491 B2
(45) Date of Patent: May 5, 2009

(54) SEMICONDUCTOR COMPONENTS AND ASSEMBLIES INCLUDING VIAS OF VARYING LATERAL DIMENSIONS

(75) Inventors: Kyle K. Kirby, Boise, ID (US); Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 55 days.

(21) Appl. No.: 11/516,424

(22) Filed: Sep. 5, 2006

(65) Prior Publication Data

US 2007/0001168 A1 Jan. 4, 2007

Related U.S. Application Data

(62) Division of application No. 10/928,598, filed on Aug. 27, 2004, now Pat. No. 7,378,342.

(51) Int. Cl.
*H01L 23/48* (2006.01)
*H01L 21/44* (2006.01)

(52) U.S. Cl. ............... 257/774; 257/E23.011; 257/E23.105; 257/E25.013; 257/E23.167; 257/E21.597; 257/775; 257/48; 257/773; 257/764; 257/786; 257/680

(58) Field of Classification Search ................ 257/774, 257/E23.011, E23.105, E25.013, E21.597, 257/E23.167, E21.17, 48, 775, 773, 764, 257/680
See application file for complete search history.

(56) References Cited

U.S. PATENT DOCUMENTS

| | | | |
|---|---|---|---|
| 4,224,101 A | 9/1980 | Tijburg et al. | |
| 5,269,880 A | 12/1993 | Jolly et al. | |
| 5,841,196 A | 11/1998 | Gupta et al. | |
| 5,847,466 A * | 12/1998 | Ito et al. ............... | 257/775 |
| 5,913,146 A * | 6/1999 | Merchant et al. ........... | 438/646 |
| 6,022,797 A | 2/2000 | Ogasawara et al. | |
| 6,054,377 A | 4/2000 | Filipiak et al. | |
| 6,080,664 A | 6/2000 | Huang et al. | |
| 6,114,240 A | 9/2000 | Akram et al. | |
| 6,400,172 B1 | 6/2002 | Akram et al. | |
| 6,448,644 B1 | 9/2002 | Lin | |
| 6,451,683 B1 | 9/2002 | Farrar | |
| 6,642,146 B1 | 11/2003 | Rozbicki et al. | |
| 6,841,883 B1 | 1/2005 | Farnworth et al. | |
| 2002/0038903 A1 | 4/2002 | Tsau | |
| 2003/0020180 A1 | 1/2003 | Ahn et al. | |
| 2005/0260775 A1 | 11/2005 | DiBattista et al. | |
| 2006/0003578 A1 | 1/2006 | Lee et al. | |

OTHER PUBLICATIONS

Wolf, S., and R.N. Tauber, "Silicon Processing for the VLSI Era," vol. 1, 2nd Edition, Lattice Press, 2000, p. 438.

* cited by examiner

Primary Examiner—Alexander O Williams
(74) Attorney, Agent, or Firm—TraskBritt

(57) ABSTRACT

Methods for forming vias are disclosed. The methods include providing a substrate having a first surface and an opposing, second surface. A first opening, a second opening, and a third opening are formed in a substrate such that the first opening, the second opening, and the third opening are in communication with each other. A portion of the first opening, the second opening, and the third opening are filled with a conductive material. Semiconductor devices, including the vias of the present invention, are also disclosed. Semiconductor components and assemblies resulting therefrom, and an electronic system, including the vias of the present invention, are further disclosed.

41 Claims, 5 Drawing Sheets

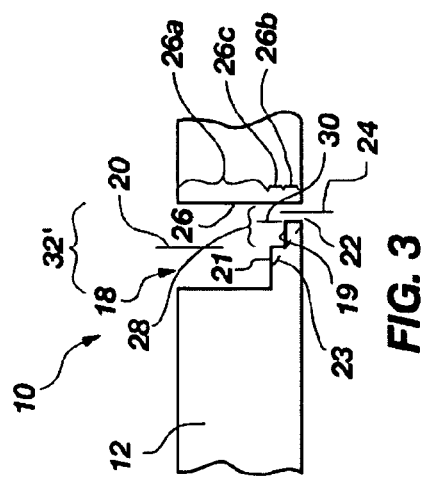
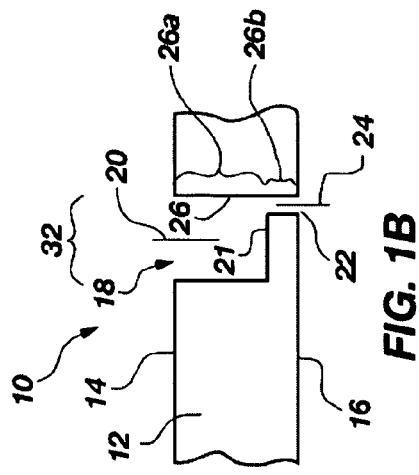
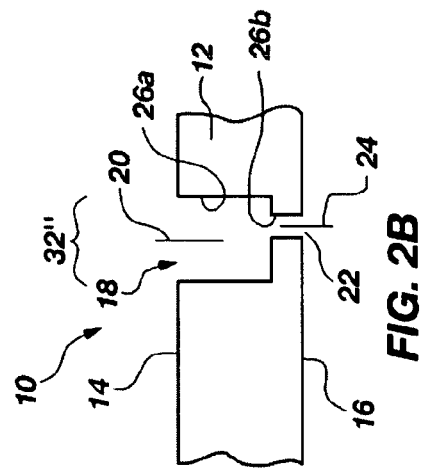
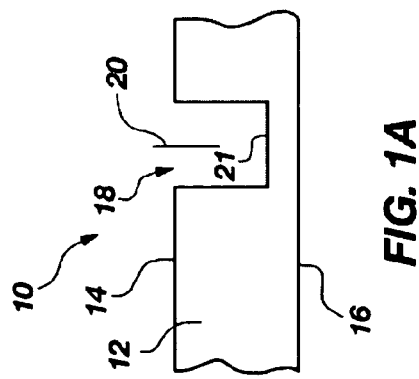
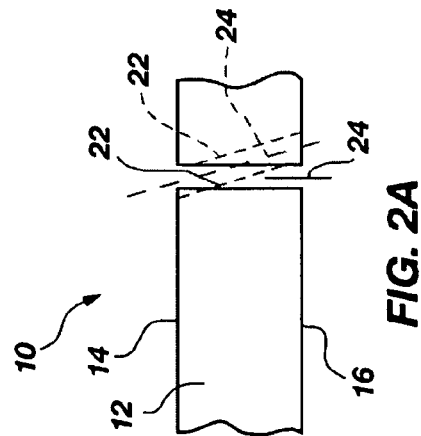

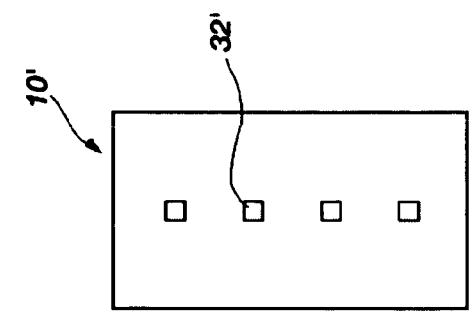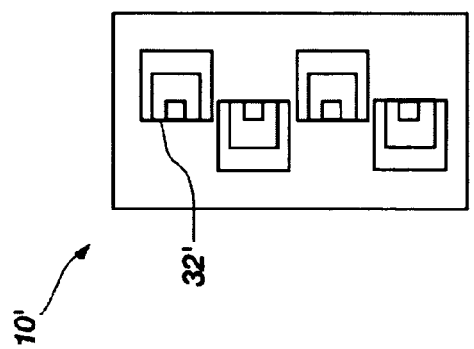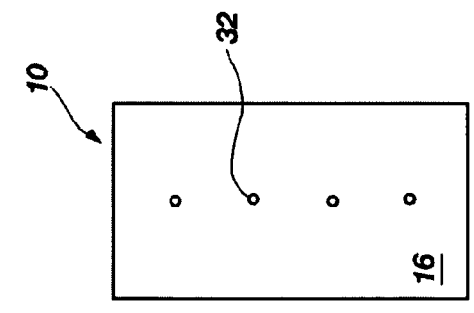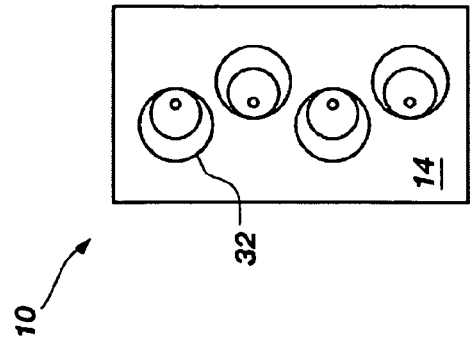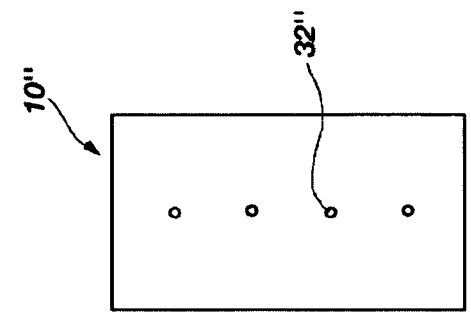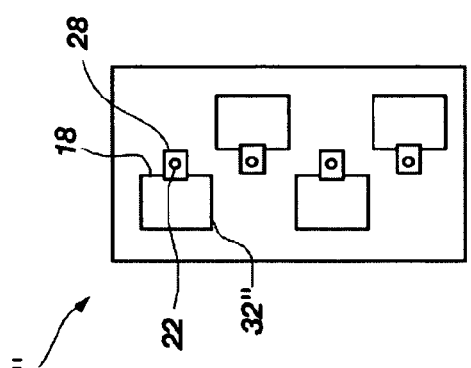

SEMICONDUCTOR COMPONENTS AND ASSEMBLIES INCLUDING VIAS OF VARYING LATERAL DIMENSIONS

CROSS-REFERENCE TO RELATED APPLICATION

This application is a divisional of application Ser. No. 10/928,598, filed Aug. 27, 2004, now U.S. Pat No. 7,378,342, issued May 27, 2008.

BACKGROUND OF THE INVENTION

1. Field of the Invention

The present invention relates generally to semiconductor component fabrication. More particularly, the present invention relates to methods of forming vias of varying lateral dimensions for use in semiconductor components and assemblies.

2. State of the Art

Conventional semiconductor components, such as semiconductor dice, have external contacts that enable electrical connections to be made from an active surface of the semiconductor die to the integrated circuits formed on or within the active surface. For instance, semiconductor components may include external contacts in the form of discrete conductive elements, such as conductive balls or bumps, formed in an array on the die itself, or discrete conductive elements, such as wire bonds, extending from the active surface to terminals of an interposer substrate of the component or directly to a carrier substrate, such as a printed circuit board.

In other packaging configurations, test carriers for testing a semiconductor component, such as a bare semiconductor die or a chip scale package (generically termed "device under test," or "DUT"), often include contacts for making temporary electrical connections to external contacts, such as bond pads or conductive bumps, on the semiconductor component being tested. The test carriers also include contacts such as pins or pads for routing electrical connections from the DUT to a test board and associated test circuitry.

However, an inner lead bond (ILB) pattern on the active surface of a semiconductor die may include contacts in the form of bond pads, which are very small, i.e., 100 microns square, very closely spaced or pitched (typically along or adjacent a center line of the die or along a periphery of the die) and, as a result, are difficult to align with and electrically contact because of their relatively small size. Thus, wire bonding may be difficult, as may probe testing or burn-in of the semiconductor die.

To electrically connect to the small contacts in the ILB pattern, the contacts in the form of bond pads of the ILB pattern may be redistributed to other locations on the active surface using a redistribution layer (RDL). The RDL comprises a plurality of conductive traces extending from the bond pads of the ILB pattern to redistribute the contact locations of the ILB pattern to an outer lead bond (OLB) pattern that includes terminal pads that are about 240 microns square, more widely pitched and, thus, easier to electrically contact. However, the formation of the RDL traces and redistributed contact pads requires at least one extra step in the fabrication process of a semiconductor die and adds time and expense to the fabrication process.

Another method of providing external electrical contacts to integrated circuitry of a semiconductor die is to form vias extending between the active surface and the back side of the semiconductor die (typically while the die is at the wafer level and in conjunction with the formation of vias in all of the semiconductor dice of the wafer or other bulk substrate) and to fill the vias with a conductive material. However, one problem of conventionally providing vias through semiconductor dice from an ILB pattern is that the size and pitch of the bond pads have been continually decreasing while the total number of bond pads on a single semiconductor die has been continually increasing due to ongoing advances in semiconductor fabrication and increased circuit complexity. For example, a chip scale package can include a hundred or more external contacts, each having a lateral extent of about 10 mils and a pitch of about 30 mils. While it is possible to reroute the ILB pattern on the active surface of a semiconductor die and then form vias through the semiconductor die substrate from redistributed contact locations to the back side thereof, such an approach is self-defeating as still requiring an RDL extending to the via locations. Further, there may not be sufficient space, or "real estate," on the active surface to provide sufficient redistributed locations for vias.

Accordingly, efficient back side connection of small, densely pitched bond pads on semiconductor dice using conventional techniques requires correspondingly small and densely pitched conductive vias. However, such conductive vias can be difficult to form, to align with the pads of the ILB bond pattern and to fill with a conductive material. Moreover, processes useful for filling small vias, such as chemical vapor deposition (CVD), sputtering, electroplating, and electroless plating, are relatively slow and may result in voids, or "keyholing," within a via, resulting in a poor or defective electrical path.

Accordingly, a need exists for a method of fabricating through-hole vias that are easy to connect to bond pads of an ILB pattern while still efficient to form and conductively fill. Further, it would be desirable to have the ability to form a through-hole via that exhibits a larger cross-sectional area or dimension on one side (for example, a back side) of a semiconductor component, such as a semiconductor die, and is effectively more widely pitched from any adjacent via to facilitate connection to another semiconductor component while exhibiting a smaller cross-sectional area or dimension on the opposing side (for example, an active surface) of the semiconductor component directly connected to a bond pad of an ILB pattern.

BRIEF SUMMARY OF THE INVENTION

The present invention, in exemplary embodiments, overcomes the above-cited difficulties in the form of methods for forming conductive through-hole vias, which are also sometimes known as "through-wafer interconnects," or "TWIs," in semiconductor components and semiconductor components and assemblies resulting therefrom. The inventive methods of forming the conductive through-hole vias include forming through-hole vias that have a relatively larger cross-sectional dimensioned portion opening on one side of a substrate and a relatively smaller cross-sectional dimensioned portion opening on the opposing side of the substrate. The present invention also has utility in forming so-called "blind" vias, which do not extend completely through the thickness of a substrate.

Forming an opening having a larger cross-sectional dimension enables easier creation of the through-hole via. The larger-dimension openings are also easier to clean or etch during the through-hole via formation process and easier to fill with a conductive material than conventional, small, through-hole vias. Since semiconductor components fabricated using the methods of the present invention have conductive through-hole vias with a larger cross-sectional dimension opening on one side of the substrate and a smaller cross-sectional dimension opening on the opposing side of the substrate, the conductive through-hole vias are easier to align to smaller terminal or bond pads of another component and, thus, enable the stacking of semiconductor dice wherein at least one die includes the conductive through-hole vias.

In one exemplary embodiment, a method for forming a conductive through-hole via in a semiconductor device is disclosed. The method includes providing a substrate having a first surface and an opposing, second surface. A first opening having a first cross-sectional dimension is formed in the first surface of the substrate such that the first opening is defined by a first sidewall and a bottom surface. A second opening is formed in the bottom surface of the first opening such that the second opening has a second, smaller cross-sectional dimension defined by a second sidewall and communicates with the first opening. The second opening may be positioned in the bottom surface of the first opening such that a portion of the second sidewall of the second opening aligns, or is coincident, with a portion of the first sidewall of the first opening. The first and second openings may be filled with the same or different conductive materials to complete the conductive through-hole via. A third opening of intermediate cross-sectional dimension may be formed between the first and the second openings to create a step-down via profile, wherein the via becomes progressively smaller between one side of a semiconductor device and the other.

A further exemplary embodiment comprises another method for forming a conductive through-hole via in a semiconductor device. The method comprises providing a substrate having a first surface and an opposing, second surface. A first opening having a first longitudinal axis and a first cross-sectional dimension and a second opening having a second longitudinal axis and a second, cross-sectional dimension are formed in a substrate such that the first axis and the second axis are not coaxial. The first and second openings may be filled with the same or different conductive materials to complete the conductive through-hole via. A third opening of intermediate cross-sectional dimension may be formed between the first and the second openings to create a step-down via profile. The longitudinal axes of the first, second and third openings may be parallel but laterally offset, or may lie at acute angles with respect to one another.

Yet another exemplary embodiment comprises a semiconductor component having at least one conductive through-hole via. The semiconductor component includes a substrate having a first surface and an opposing, second surface. The at least one conductive through-hole via comprises a first opening in the first surface of the substrate having a first cross-sectional dimension and defined by a first sidewall and a bottom surface. The at least one conductive through-hole via further includes a second opening in the bottom surface of the first opening, wherein the second opening has a second cross-sectional dimension smaller than the first cross-sectional dimension and defined by a second sidewall. A portion of the first sidewall of the first opening may align with a portion of the second sidewall of the second opening. The at least one conductive through-hole via also includes at least one conductive material that extends through the conductive through-hole via between the first and second surfaces. The at least one conductive via may include a third opening of intermediate cross-sectional dimension between the first and second openings. The resulting step-down profile of the at least one conductive through-hole via may be used to offset the larger, first opening laterally from the smaller, second opening to provide a larger pitch or spacing between first openings of vias on the first surface while permitting the smaller, second openings on the second, opposing surface to remain at a smaller pitch or spacing.

A semiconductor component assembly, including at least one conductive through-hole via having at least two openings with an edge-aligned sidewall, is encompassed by the present invention. The semiconductor package comprises a substrate having a first surface and an opposing, second surface. The substrate has at least one conductive via formed therein that includes a first opening in the first surface of the substrate and defined by a first sidewall and a bottom surface. The at least one conductive via also includes a second opening in the bottom surface of the first opening and is defined by a second sidewall. A portion of the first sidewall of the first opening may be aligned with a portion of the second sidewall of the second opening. The at least one conductive through-hole via may include a third opening of intermediate cross-sectional dimension between the first and second openings. The at least one conductive via is also at least partially filled with a conductive material to provide an electrical path extending between the first and second opposing surfaces. The semiconductor component also includes a first contact structure proximate to the first surface of the substrate and a second contact structure proximate to the opposing, second surface of the substrate, wherein the first and second contact structures are in electrical communication with the conductive material within the at least one conductive through-hole via. The semiconductor package also includes a semiconductor die in electrical communication with the first contact structure.

A method for forming a semiconductor component assembly is further disclosed. The method includes providing a substrate having a first surface and an opposing, second surface. At least one conductive through-hole via is placed in the substrate by forming a first opening in the first surface of the substrate and a second opening in the substrate. The first opening is formed to have a first dimension and is defined by a first sidewall. The second opening is defined by a second dimension and a second sidewall, wherein the second opening communicates with the first opening through a bottom surface thereof. The second opening is positioned in the substrate such that a portion of the first sidewall of the first opening may be aligned with a portion of the second sidewall of the second opening. The at least one conductive via may include a third opening of intermediate cross-sectional dimension between the first and second openings. The conductive through-hole via is filled with at least one conductive material. A first contact structure formed on the first surface of the substrate electrically communicates with the conductive material within the at least one conductive via. A second contact structure formed proximate to the opposing, second surface of the substrate communicates with the conductive material within the at least one conductive via. A semiconductor die is electrically connected to the first contact structure.

A system including a conductive via of the present invention is also disclosed. The system includes at least a microprocessor and a memory device operably coupled with the microprocessor. The memory device includes a substrate having a first surface and an opposing, second surface. At least one conductive via in the substrate includes a first opening formed in the first surface of the substrate and is defined by a first sidewall and a bottom surface. The conductive via also includes a second opening formed in the bottom surface of the first opening and is defined by a second sidewall. The first sidewall of the first opening may be aligned with a portion of the second sidewall of the second sidewall of the second opening. The at least one conductive via may include a third opening of intermediate cross-sectional dimension between the first and second openings. The conductive via further includes a conductive material.

The present invention also encompasses semiconductor component assemblies including heat sinks, test probes for testing of semiconductor components, and stacked semiconductor component assemblies including a plurality of semiconductor components. As noted previously, the present invention further comprises so-called blind vias that may not extend completely through a substrate, and also vias that may be employed to facilitate heat transfer as well as, or in lieu of, electrical connections. The invention specifically encompasses the formation of vias that terminate at an underside of a bond pad of a semiconductor die.

BRIEF DESCRIPTION OF THE SEVERAL VIEWS OF THE DRAWINGS

In the drawings, which illustrate what is currently considered to be the best mode for carrying out the invention:

FIGS. 1A and 1B illustrate acts of an exemplary embodiment of a method for forming through-hole vias of the present invention;

FIGS. 2A and 2B depict acts of another exemplary embodiment of a method for forming through-hole vias of the present invention;

FIG. 3 is a cross-section of a semiconductor component having a through-hole via formed using methods of the present invention;

FIGS. 6A and 6B depict top and bottom views, respectively, of through-hole vias formed using methods of the present invention;

FIGS. 7A and 7B illustrate another exemplary embodiment of through-hole vias formed using methods of the present invention;

FIGS. 8A and 8B exemplify another exemplary embodiment of through-hole vias formed using methods of the present invention;

DETAILED DESCRIPTION OF THE INVENTION

Figure 4:
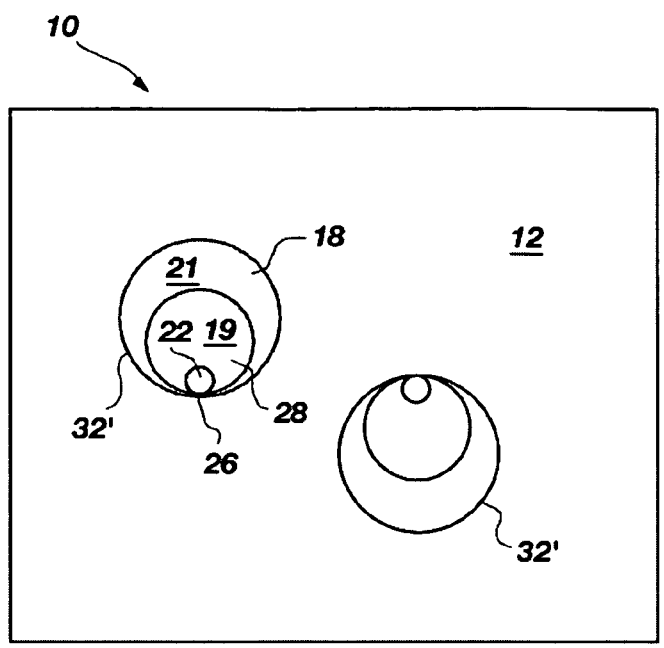
FIG. 4 is a top view of a semiconductor device having two through-hole vias of the present invention.

Generally, the present invention discloses methods for fabricating vias extending between one surface and an opposing surface of the substrate of a semiconductor component. The through-hole vias of the present invention may be used in stacked semiconductor component configurations, for connections to heat sinks, for contact alignment to test probes and test interposers, for use in test probes, for systems including semiconductor devices and for other semiconductor component applications.

Referring to the accompanying drawings, wherein similar features and elements are identified by the same or similar reference numerals, various embodiments of methods for fabricating through-hole vias through the thickness of a wafer or other substrates are illustrated. In the drawings used to illustrate the exemplary embodiments, the drawings and various elements depicted in the drawings are not drawn to scale, but are illustrative. It will be apparent by those of ordinary skill in the art that while the methods and structures disclosed herein describe methods for fabricating through-hole vias and semiconductor components resulting therefrom, the acts and structures described herein comprise a portion of an entire fabrication process of a semiconductor device or other substrate and may be used in combination with other semiconductor fabrication methods.

Referring now to FIG. 1A, there is shown a cross-section of a semiconductor component generally at 10. As used herein, the term "semiconductor component" is not limited to semiconductor dice having active circuitry thereon, but encompasses other substrates employed in packaging, mounting and testing of assemblies incorporating semiconductor dice. Semiconductor component 10 includes a substrate 12 that in the exemplary embodiment may comprise a material such as monocrystalline silicon, silicon-on-glass, silicon-on-sapphire, gallium arsenide, indium phosphide, germanium, a ceramic, a plastic or a glass filled resin material (e.g., FR-4). As used herein, the term "substrate" refers to any generally planar supporting structure including, but not limited to, semiconductor wafers, interposer substrates or other semiconductor component structures. However, solely for the sake of ease and clarity of description, the method of the present invention will be described herein with reference to a monocrystalline silicon substrate in the form of a wafer. The substrate 12 has a first surface 14 and an opposing second surface 16. The first surface 14 of the substrate 12 has a first opening 18 of a first cross-section formed therein. In this exemplary embodiment, the first opening 18 has a first longitudinal axis 20 and may be formed in the substrate 12 by, for example, laser ablation or machining. The first axis 20 may define a center point of the first opening 18. A representative dimension, or diameter, of the first opening 18 may be from about 10 µm to about 2 mils or greater. The depth of the first opening 18 is such that the first opening 18 creates a blind via, i.e., the first opening does not extend through the substrate 12. A bottom surface 21 of the first opening 18 defines a lowermost portion of the first opening 18. The cross-section of the first opening 18 transverse to first axis 20 may be of a circular shape, but it will be appreciated by those of ordinary skill in the art that the cross-sectional shape of the first opening 18 may be any other known shape for forming through-hole vias including, without limitation, rectangular, square, trapezoidal, oval, teardrop and any combinations thereof.

Laser drilling may be effected using equipment, such as the Model 5000-series lasers, offered currently by ElectroScientific Industries of Portland, Oreg. One specific, suitable piece of equipment is a 355 nm wavelength UV YAG laser, Model 2700, which may be used to form vias. Another suitable laser system is the Xise 200, offered by Xsil Ltd. of Dublin, Ireland, which company also has a U.S. office in Loveland, Colo. The Xsil product may be used to form vias as small as about 10:m to about 15:m in diameter. The areas of substrate 12 irradiated by the laser may reach a temperature of 1400° C. It is currently believed that at temperatures higher than 600° C. damage occurs to active regions within substrate 12. By using a plurality of short bursts from the laser, heat flow into the substrate 12 due to the thermal input from the laser is minimized during the forming of first opening 18 and deleterious effects, such as dopant redistribution within an adjacent active region does not occur. A 355 nm wavelength laser, as previously referenced, may be operated at a power of about 4 to 9 W, for example 5 W, and from about a 20 kHz to a 60 kHz cycle or repetition rate to form first opening 18. If laser drilling is used to form first opening 18, a wet etchant, such as an HF-based etch, may be used to remove the native oxide present on the substrate 12. The laser drilling may be followed by a 6% tetramethyl ammonium hydroxide (TMAH) in propylene glycol solution wet process to smooth the silicon and remove any debris resulting from the laser drilling process.

In lieu of laser ablation or machining, the first opening 18 may be formed by any other known method of forming through-hole vias or openings in the substrate 12 that is appropriate for the type of material used to fabricate the substrate 12 including, without limitation, a wet etch process, a dry etch process, mechanical drilling, or any combination thereof. One suitable wet etchant for silicon is hydrofluoric acid (HF). Another particularly suitable wet etchant for silicon in situations where metal may be encountered, for example, is 6% tetramethyl ammonium hydroxide (TMAH) in propylene glycol solution. An isotropic wet etchant, such as, for example, 20% to 25% TMAH at 90° C. or 22% KOH at 75° C. may also be used, but an additional silicon oxide, silicon nitride or some other resistant mask layer may then be required to protect any exposed metal on the substrate from being etched. Wet etching may be desirable, for instance, if the substrate 12 is a semiconductor substrate in the form of a plurality of unsingulated semiconductor dice, including layers of integrated circuitry (not shown) formed therein adjacent second surface 16, which may comprise an active surface, heat produced from a laser ablation or machining process used to form first opening 18 in substrate 12 may damage the surrounding semiconductor material, forming a so-called heat-affected zone (HAZ), which is typically etched to clean the via. Where first opening 18 is relatively large, the amount of heat generated by the laser beam becomes significant and may lead to damage to the integrated circuitry itself. Thus, the first opening 18 may be formed with a wet etch or, less typically, a dry etch (reactive ion etch, or RIE) process appropriate for the type of substrate 12 to avoid this problem.

Referring now to FIG. 1B, there is illustrated the semiconductor component 10 of FIG. 1A with through-hole 32 including a second opening 22 of smaller cross-section than that of first opening 18 formed in the bottom surface 21 of the first opening 18 and extending through the substrate 12 such that the second opening 22 may extend through the second surface 16 of the substrate 12, or may terminate at a bond pad on second surface 16, as discussed hereinafter. As noted above, a 6% TMAH in propylene glycol etch solution may be desirably employed if second opening 22 terminates as a blind opening at a bond pad. The second opening 22 has a second longitudinal axis 24 that may define a center point of the second opening 22. The second opening 22 may desirably be formed by laser ablation or machining for speed and accuracy, but may also be formed using a wet etch process, a dry etch process such as reactive ion etching (RIE), or a combination thereof. As illustrated, the first longitudinal axis 20 of the first opening 18 and the second longitudinal axis 24 of the second opening 22 are not coaxial, but are laterally offset to a degree. The first opening 18 and the second opening 22 are formed such that the first opening 18 and the second opening 22 share a portion of a sidewall 26 in a common edge alignment, wherein at least a portion 26a of the sidewall of the first opening 18 and a portion 26b of the sidewall of the second opening 22 are substantially aligned. Such alignment may be at a common tangent point if first opening 18 and second opening 22 are each substantially circular, so that the aligned portion of sidewall 26 comprises a vertical line parallel to the longitudinal axes 20 and 24 of the first and second openings 18 and 22, or may be substantially wider if different cross-sectional shapes for first and second openings 18, 22 are employed. While first and second axes 20, 24 are depicted as mutually parallel, this is not a requirement of the invention, and it is contemplated that, for example, second axis 24 of second opening 22 (and, thus second opening 22) may be disposed or oriented at an acute angle to first axis 20 of first opening 18 as shown in broken lines in FIG. 2A to provide more offset between the mouth of first opening 18 and the mouth of second opening 22.

Referring now to FIG. 3, there is shown a cross-section of the semiconductor component 10 of FIG. 1B depicting a through-hole 32' after an optional third opening 28 (indicated with brackets) is formed, at least partially, in the bottom surface 21 of the first opening 18. The third opening 28 may be formed in the bottom surface 21 of the first opening 18 by laser ablation or machining or, as previously described herein, with a wet etch process, a dry etch process or a combination thereof. In practice, third opening 28 may be desirably formed prior to second opening 22. The third opening 28 has a third axis 30, which may be parallel, but not coaxial, with the first axis 20 or the second axis 24. Again, first, second and third axes 20, 24 and 30 may or may not be mutually parallel. The third opening 28 may be formed such that a portion 26c of the sidewall of the third opening 28 is aligned with the portion 26a of the sidewall of the first opening 18 and the portion 26b of the sidewall of second opening 22. The combination of the first, second and third openings 18, 22 and 28 being laterally offset and having different cross-sectional dimensions creates a step-down structure for the aperture. As illustrated, the first opening 18, the second opening 22 and the third opening 28 may be edge-aligned along the common sidewall 26 and, in combination, the three openings 18, 22 and 28 form a generally tear-drop-shaped through-hole 32' through the substrate 12. The tear-drop shape allows the first, second and third openings 18, 22 and 28 to converge from the larger openings of the first surface 14 of the substrate 12 and to neck down to a high density row of pads (not shown) corresponding to the smaller openings on the second surface 16 of the substrate 12. Of course, it is contemplated that a through-hole of the present invention may be formed with only first and second openings 18 and 22.

It will be apparent by those of ordinary skill in the art that the step-down effect created in the through-hole 32' by the three openings 18, 22 and 28, each having different dimensions and, optionally, different cross-sectional shapes, may have any number of "steps" formed by any number of openings as the number of "steps" will vary depending on the circuit density in the semiconductor component 10. In another exemplary embodiment, the "steps" created by the three openings 18, 22 and 28 may be smoothed, as by etching, to form a slanted, asymmetrical, substantially frustoconical surface as illustrated by dashed line 23 in FIG. 3.

A top view of the semiconductor component 10 of FIG. 3 is illustrated in FIG. 4. As illustrated, the semiconductor component 10 includes two through-holes 32', but it will be apparent to those of ordinary skill in the art that the semiconductor component 10 may include any number of through-holes 32'. The first opening 18, the second opening 22 and the third opening 28 may be edge aligned along the sidewall 26 and the step down effect is illustrated wherein the bottom surface 21 of the first opening 18 and a bottom surface 19 of the third opening 28 do not extend through the substrate 12, while the second opening 22 extends through the substrate 12.

Referring now to FIGS. 2A and 2B, there is illustrated another exemplary method used to form a through-hole 32" in a semiconductor component 10. As shown in FIGS. 2A and 2B, the semiconductor component 10 includes substrate 12 and has a second opening 22 with a second axis 24 formed through the substrate 12 and extending from the first surface 14 to the second surface 16. Both the first opening 18 and the second opening 22 may be formed by laser drilling or other known processes, as previously described herein. In the exemplary embodiment, the depth of the second opening 22 is substantially different than the depth of the second opening 22 as described with reference to FIG. 1B, extending completely through substrate 12, having been formed prior to first opening 18. It will be apparent that the designation of the second opening 22 does not refer to any particular order in which the openings are to be formed, but indicates that the methods described with reference to FIGS. 2A and 2B are used to form substantially the same openings of the through-hole 32" of FIG. 2B as the method described with reference to FIGS. 1A and 1B, albeit in a different alignment.

As shown in FIG. 2B, a first opening 18 is also formed in the first surface 14 of the substrate 12. The first opening 18 has a first axis 20 that is not coaxial with the second axis 24 of the second opening 22, but is not laterally offset therefrom as far as in the through-hole via 32 of FIG. 1B so that there is no mutual alignment of sidewall 26a and sidewall 26b. In the exemplary embodiments of FIGS. 1A-1B and 2A-2B, the through-holes 32 and 32" each include two openings 18 and 22 of different respective diameters and depths in the first surface 14 and second surface 16 of the substrate 12. It will be appreciated by those of ordinary skill in the art that the through-holes 32 and 32" of FIGS. 1B and 2B may be formed by forming the openings 18 and 22 in any order. For instance, the second opening 22 may be formed in the substrate 12 first, followed by forming the first opening 18. It should be noted that forming the larger, first opening 18 first by wet etching may minimize damage to substrate 12. Relatively short and small diameter (or other lateral dimension) second opening 22 may then be formed by laser ablation or machining, conserving the thermal budget of the substrate 12 and minimizing the potential for heat-induced damage to active circuitry thereon.

In the foregoing exemplary embodiments, the through-holes may be formed as through-chip vias or TWIs using a laser drilling technology that is capable of drilling holes as small as about 10:m to about 15:m in lateral dimension. However, it is contemplated that the method of the present invention may also be suitable for forming interlevel connections. As known in the art, interlevel connection vias are usually measured in angstroms and are conventionally formed by etching. With further improvements in laser technology, openings formed by the methods of the present invention may be formed to smaller dimensions and may, thus, be suitable for interlevel connections.

After formation of a through-hole 32, 32' or 32" the inner surfaces thereof may require cleaning. Since the openings in the through-holes 32, 32' or 32" in the exemplary embodiments may be created at least in part by laser machining, heat from the laser machining process may damage the substrate 12, such as silicon, that surrounds the through-hole 32, creating a so-called heat-affected zone, or HAZ. Accordingly, the substrate material immediately surrounding through-holes 32, 32' or 32" may be cleaned with an etch process, or other known process, before being filled with the conductive material. The etch process removes the HAZ surrounding the through-holes 32, 32' or 32". The larger dimension openings, i.e., the first opening 18, in the through-holes 32, 32' or 32" may be cleaned using a wet etch process, which is typically faster than a dry etch process. One suitable etchant for cleaning a larger, first opening 18 is the aforementioned 6% TMAH in a propylene glycol solution. The presence of the larger dimension first opening 18 allows a large portion of a through-hole 32, 32' or 32" to be cleaned rapidly and effectively using a wet etch chemistry. However, the smaller diameter openings, i.e., the second and (optionally) third openings 22, 28, of the through-holes 32, 32' or 32" may require dry etch (reactive ion etch, or RIE) cleaning, since wet etchants may not be able to effectively enter and clean the smaller dimension openings 22, 28. Thus, a combination of dry etch and wet etch cleaning processes may be used to clean the openings of the through-holes 32, 32' or 32".

In another exemplary embodiment, the inner surfaces of the openings of the through-holes 32, 32' or 32" may be passivated with a dielectric layer (not shown), depending on the type of material used for the substrate 12. The dielectric layer may comprise any known insulating material, such as silicon oxide or silicon nitride, deposited to any desired thickness using CVD or other known deposition process. The dielectric layer may also be grown on exposed surfaces of the substrate 12 using an oxidizing atmosphere, such as steam and oxygen at an elevated temperature. The insulation layer may also comprise an insulating polymer, such as a polyamide, deposited using a suitable process such as a spin on process or an injection or capillary process.

Figure 5A:
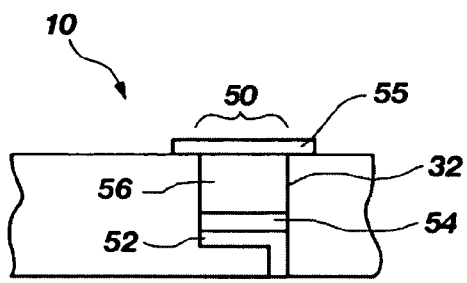
FIGS. 5A through 5C illustrate conductive vias filled with conductive material using methods of the present invention.
Figure 5B:
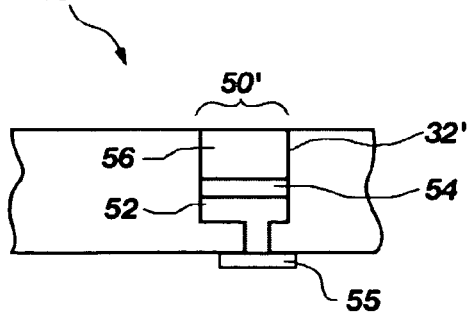
Figure 5C:
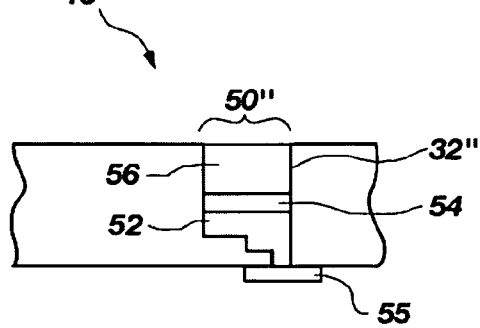

The through-hole 32, 32' or 32" may be filled with one or more conductive materials to form a conductive via 50. Referring now to FIGS. 5A-5C, there are illustrated three cross-sections of three semiconductor components 10, 10' and 10" having three different configurations of filled conductive vias 50, 50' and 50", respectively.

In the exemplary embodiments of FIGS. 5A-5C, the through-holes 32, 32' or 32" are filled with conductive materials, such as conductive metals, in a plurality of layers. Since the smaller openings, i.e., second opening 22 (FIGS. 1B, 2B, 3), in the through-holes 32, 32' or 32" may be as small as about 10-20 μm in lateral dimension, a physical vapor deposition (PVD, or sputtering) process or chemical vapor deposition (CVD) process may be used to fill the smaller openings of the through-hole with the conductive material. The presence of the larger dimension openings, i.e., first opening 18, makes filling the majority of the volumes of through-holes 32, 32' or 32" faster and more efficient. In an exemplary embodiment, aluminum may be sputtered as a first conductive layer 52 as illustrated in FIGS. 5A-5C. The use of aluminum is particularly desirable if an aluminum bond pad 55 (see FIGS. 5B and 5C) lies at the bottom of a through-hole 32, 32' or 32". The first conductive layer 52 may be coated with a second conductive layer 54. Since sputter coating and CVD processes are relatively slow, the second conductive layer 54 may be plated using an electroless or an electrolytic plating process as known in the art, which is faster than sputter coating or CVD. In the exemplary embodiment, the second conductive layer 54 may be nickel or copper, which are particularly suitable if the remainder of through-holes 32, 32' or 32" are to be filled with a solder, as these two metals are highly wettable by most solders. A third conductive layer 56 may be formed over the second conductive layer 54 and in the exemplary embodiment, comprises a solder paste or conductive particles in an organic carrier deposited in first opening 18, facilitated by that opening's much larger cross-section. A solder paste may be physically placed into the through-holes 32, 32' or 32", for example, by use of a squeegee process. The conductive particles may comprise silver nanoparticles in an organic carrier that are available from vendors including Emulsitone of Whippany, N.J. and Superior Micropowders of Albuquerque, N. Mex. In either case, the semiconductor component 10, 10' or 10" may then be heated to reflow the solder or melt the silver nanoparticles, fill the through-holes 32, 32' or 32", drive off any volatile organics and form conductive vias 50, 50' or 50".

In other exemplary embodiments and depending on the sizes and depths of the openings making up the through-holes 32, 32' or 32", the conductive material in the conductive vias 50, 50' and 50" may be plugs of a single metal that completely fill the conductive vias 50, 50' and 50", although this approach may be difficult to effectuate if the smaller openings 22 and 28 are of extremely small dimensions. In such an instance, the smaller openings 22, 28 may be filled by CVD or PVD (sputtering) processes and opening 18 may be filled by electroless or an electrolytic plating process as known in the art. In other exemplary embodiments, the conductive vias 50 may comprise one or more layers of conductive material that cover or line the inside surfaces or sidewalls of the openings, while the interiors of the conductive vias 50, 50' and 50" are filled with a nonconductive material. In such an instance, a conductive pad may then be formed over the end of the conductive via in communication with the conductive lining. In addition to the conductive metals listed with regard to the above-described exemplary embodiment, other conductive metals that may be used to fill the conductive vias 50 include, without limitation, titanium, iridium, gold, tungsten, silver, platinum, palladium, tantalum, molybdenum, tin, zinc, alloys of these metals, including solder, and any combinations thereof.

In addition to using conductive metals to fill the conductive vias 50, the conductive material may comprise a conductive or conductor-filled polymer. For instance, the conductive or conductor-filled polymer may be deposited in the through-holes as a viscous, flowable material and cured as required. Suitable deposition processes for conductive polymers include screen printing or stenciling. Other suitable conductive polymers may include a nanoparticle paste or ink having metal nanoparticles made of conductive metal, such as aluminum.

Once the conductive via 50, 50' or 50" is filled with conductive material, a conductive path extends from contact or bond pad 55, such as an ILB pad, lying over at least a portion of the opening of conductive via 50' as illustrated in FIG. 5B or the conductive via 50" of FIG. 5C. The bond pads 55 would generally have been formed previously by a conventional process during fabrication of integrated circuitry on a substrate 12 of a semiconductor component 10' or 10" if those components comprise semiconductor dice. In such an instance, conductive via 50, 50' or 50" would comprise a blind via terminating at the underside of a bond pad 55. If the substrate in question is other than a semiconductor die, however, bond pads 55 may be formed subsequent to the conductive filling of a conductive via 50, 50' or 50" by plating or other deposition processes well known in the art.

Referring now to FIGS. 6A and 6B, there is shown a top view and a bottom view, respectively, of the semiconductor component 10 of FIG. 3 including four through-holes 32. FIG. 6A illustrates the four through-holes 32 in a laterally staggered, or offset, configuration on the first surface 14 of the semiconductor component 10 and FIG. 6B depicts the smaller diameter openings of the four through-holes 32 in a substantially linear configuration, such as an inner lead bond (ILB) pattern in a row, on the second surface 16 of the semiconductor component 10. By staggering, or offsetting, the larger diameter openings of the through-holes 32 (for example) on opposing sides of a substantially linear path on the first surface 14 and aligning the smaller diameter openings of the through-holes 32 on the linear path on the second surface 16, the smaller dimension opening of the through-holes 32 on the second surface 16 may be electrically connected to small bond pads in a higher density, smaller pitch row, while the corresponding larger dimension openings of the through-holes 32 on the first surface 14 that extend away from the smaller dimension openings may be aligned to contact pads on another, superimposed semiconductor component with less precision. Thus, the larger dimension openings on the first surface 14 will be easier to align to contact or bond pads on another semiconductor component, such as another die, interposer or other carrier substrate, and require less precision than the precise placement and alignment of the smaller openings on the second surface 16.

FIGS. 7A and 7B illustrate a top view and a bottom view, respectively, of another exemplary embodiment of a semiconductor component 10' of the present invention. FIG. 7A illustrates the semiconductor component 10' having square-shaped, stepped-down openings in through-holes 32', wherein the through-holes 32' are offset in the top view in relation to the smaller dimension openings depicted in the bottom view. Such cross-sections may result, for example, if the aforementioned 6% TMAH in propylene glycol solution is employed to clean the HAZ of a silicon substrate, as this solution preferentially etches certain planes of silicon.

FIGS. 8A and 8B illustrate top and bottom views, respectively, of another exemplary embodiment of a semiconductor component 10" of the present invention having a rectangular-shaped first opening 18 in combination with a smaller, square-shaped third opening 28 and a round second opening 22. The top view of through-holes 32" of FIG. 8A is illustrated in an offset configuration in relation to the bottom view of through-holes 32" of FIG. 8B, wherein the bottom view illustrates the smaller dimension openings in a substantially linear row. It should be noted that the third opening 28 lies adjacent, but outside an envelope of the first opening 18 as defined by the sidewall thereof, while second opening 22 lies completely within the envelope of third opening 28. It will be apparent to one of ordinary skill in the art that the various shapes and configurations of the through-holes described herein are exemplary and that the through-holes may be of any shape or configuration as known in the art, such as oval, trapezoidal or combinations thereof.

Figure 9:
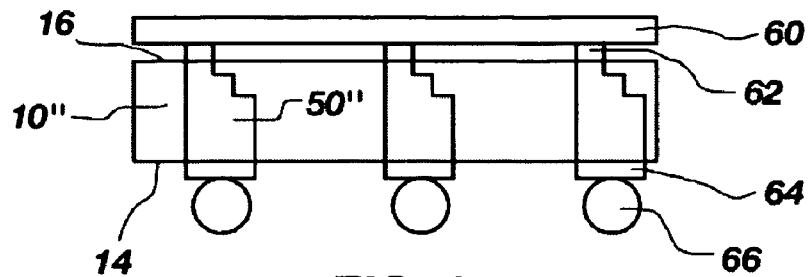
FIG. 9 illustrates a semiconductor device having conductive vias formed using methods of the present invention in a stacked chip configuration.

The conductive vias produced using the methods of the present invention have utility in many semiconductor components in various assemblies. Referring now to FIG. 9, there is shown the semiconductor component 10" of FIG. 5C in the form of an interposer substrate electrically connected to a semiconductor die 60 in a stacked configuration. The semiconductor component 10" includes three conductive vias 50", contact pads 62 on the first surface 14 of the semiconductor component 10" in electrical communication with bond pads of the flip-chip (active surface down) oriented semiconductor die 60 and the conductive vias 50", and terminal pad contacts 64 on the second surface 16 of the semiconductor component 10" in electrical communication with the conductive vias 50". The terminal pad contacts 64 of the second surface 16 are depicted in electrical communication with discrete conductive elements in the form of conductive bumps 66, which may comprise solder balls, other metal or metal-coated bumps, or conductive or conductor-filled polymer structures.

Figure 10:
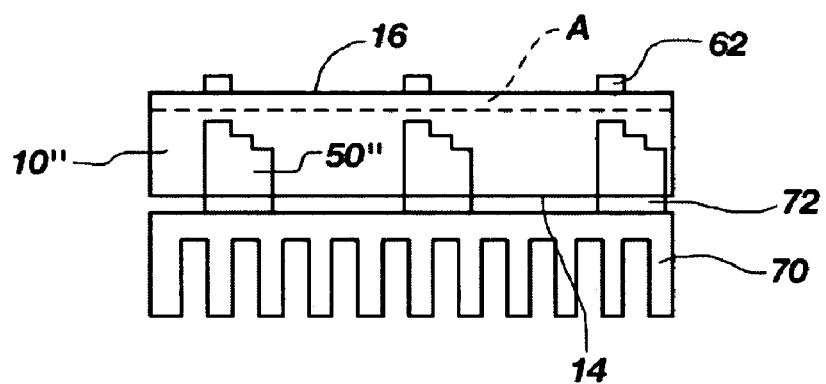
FIG. 10 illustrates a semiconductor device including conductive vias of the present invention connected to a heat sink.

In another exemplary embodiment, the semiconductor component 10" of FIG. 5C may comprise a semiconductor die or an interposer substrate connected to a heat sink 70 as illustrated in FIG. 10. In such an instance, conductive vias 50" may comprise blind vias terminating within the substrate in proximity to active circuitry A, to facilitate heat transfer therefrom. Contact pads 72 configured as thermal cooling paths connect the semiconductor component 10" and the heat sink 70, as known in the art. If semiconductor component 10" is an interposer substrate, the first surface 14 of the semiconductor component 10" opposite the heat sink 70 may be configured with contact pads 62 to be connected to another semiconductor component, such as the semiconductor die 60 of FIG. 9 or any other semiconductor component, as known in the art.

Figure 11:
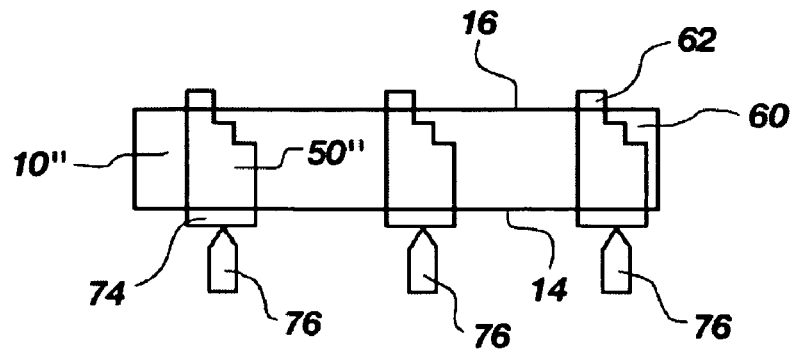
FIG. 11 illustrates a semiconductor device having conductive vias of the present invention connected to test probes and in an exemplary test interposer configuration.

FIG. 11 illustrates another exemplary embodiment of the present invention wherein contact pads 74 overlying the conductive vias 50" of the present invention are used to electrically connect the semiconductor component 10" of FIG. 5C in the form of a semiconductor die 60 to test probes 76 of a test module (not shown). Since the portion of the conductive vias 50" on the second surface 16 of the semiconductor component 10" are larger than the portion of the conductive vias 50" on the first surface 14 of the semiconductor component 10, alignment of the test module to the larger portion of the conductive vias 50" is more efficient than alignment to the smaller portion of the conductive vias 50". In another exemplary embodiment, the conductive vias 50" may be used to fabricate a test interposer in the form of semiconductor component 10" for facing contact by contact pads 62 with aligned bond pads of a semiconductor die (not shown).

Figure 12:
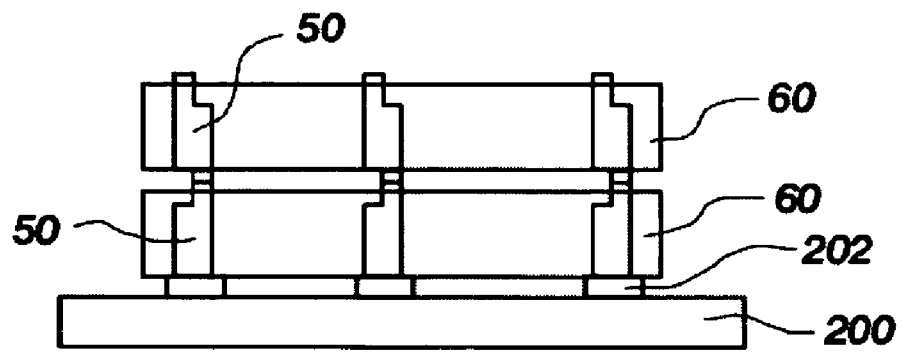
FIG. 12 illustrates a stacked semiconductor device assembly including conductive vias of the present invention.

Referring now to FIG. 12, there is depicted a stacked assembly of semiconductor components 10 in the form of semiconductor dice 60, mounted to a carrier substrate 200. Conductive vias 50 in the configuration shown in FIG. 5A connect upper and lower semiconductor dice 60 and terminal pads 202 of carrier substrate 200.

Figure 13:
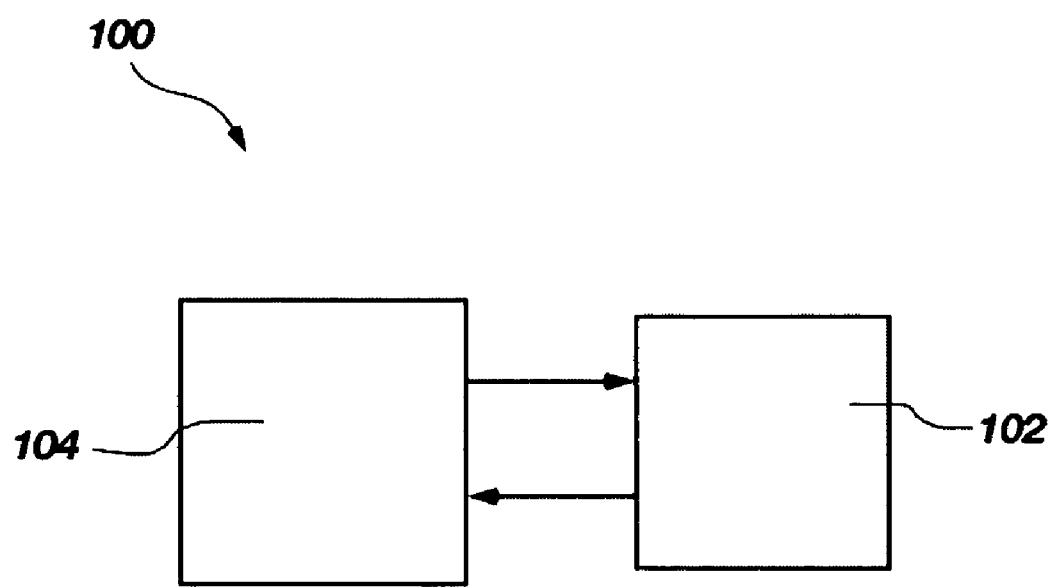
FIG. 13 is a schematic diagram of an electronic system having a component incorporating conductive vias of the present invention.

Referring now to FIG. 13, there is shown schematically a system 100 including the conductive vias 50 (not shown) of the present invention. The system 100 includes a memory component 102, such as a static random access memory (SRAM), dynamic random access memory (DRAM), or other known memory component, wherein the memory component 102 comprises a semiconductor component having conductive vias 50, 50' or 50" fabricated using methods of the present invention. The memory component 102 is operably connected to a microprocessor 104 that may be programmed to carry out particular functions as known in the art.

The above exemplary embodiments of the present invention disclose electrical interconnects in the form of conductive through-hole vias that include a large dimension opening on one side of a substrate and a smaller dimension opening on the opposing side of the substrate. The larger dimension openings are easier to create, allow for easier cleaning or etching of the through-hole and allow for easier filling of the through-hole with conductive material. Additionally, the larger dimension area of the filled conductive via is easier to align with a smaller pad and makes aligning dice in a stacked chip configuration easier and more efficient.

Although the present invention has been illustrated and described with respect to various exemplary embodiments, various additions, deletions and modifications are contemplated from the scope or essential characteristics of the present invention. Further, while described in the context of semiconductor components, the invention has utility for forming electrical interconnects in any electronic component. The scope of the invention is, thus, indicated by the appended claims rather than the foregoing description. All changes that come within the meaning and range of equivalency of the claims are to be embraced within their scope.

What is claimed is:

1. A semiconductor component, comprising:
    a substrate having a first surface and an opposing, second surface;
    at least one via in the substrate, comprising:
        a first opening having a first cross-sectional dimension in the first surface of the substrate, wherein the first opening is defined by a first sidewall and a bottom surface;
        at least a second opening having a second, smaller cross-sectional dimension extending below the bottom surface of the first opening and in communication therewith and extending within the substrate to a location adjacent the opposing, second surface, wherein the at least a second opening is defined by a second sidewall; and
        at least one conductive material filling at least a portion of the at least one via.

2. The semiconductor component of claim 1, wherein a portion of the first sidewall of the first opening is aligned with a portion of the second sidewall of the second opening.

3. The semiconductor component of claim 1, wherein the first opening has a larger cross-sectional dimension than the at least a second opening.

4. The semiconductor component of claim 1, wherein the at least a second opening extends through the opposing, second surface of the substrate.

5. The semiconductor component of claim 1, further comprising at least one conductive pad on the opposing, second surface of the substrate, and wherein the at least a second opening of the at least one via terminates at an underside of the at least one conductive pad.

6. The semiconductor component of claim 5, wherein the substrate comprises a semiconductor die including active circuitry, the opposing, second surface comprises an active surface bearing the active circuitry and the at least one conductive pad comprises a bond pad operably coupled to the active circuitry.

7. The semiconductor component of claim 1, wherein the first opening has, in cross-section, a circular shape, an oval shape, a square shape, a rectangular shape, a trapezoidal shape or combinations thereof.

8. The semiconductor component of claim 1, wherein a cross-sectional dimension of the first opening is about 10 μm to about 2 mils.

9. The semiconductor component of claim 1, wherein the at least one via further comprises:
    a third opening having a cross-sectional dimension different and intermediate the first cross-sectional dimension of the first opening and the second, smaller cross-sectional dimension of the at least a second opening and defined by a third sidewall, the third opening extending through a portion of the bottom surface of the first opening.

10. The semiconductor component of claim 9, wherein a portion of the third sidewall is aligned with a portion of the second sidewall of the at least a second opening and the first sidewall of the first opening.

11. The semiconductor component of claim 1, further comprising a passivation layer on inner surfaces of the first opening and the at least a second opening.

12. The semiconductor component of claim 1, wherein at least a portion of the first opening and the at least a second opening are filled with the at least one conductive material selected from the group consisting of aluminum, titanium, iridium, copper, nickel, gold, tungsten, silver, platinum, palladium, tantalum, molybdenum, tin, lead, zinc, alloys of these metals including solder, and any combinations thereof, a conductive polymer and a conductor-filled polymer.

13. The semiconductor component of claim 1, wherein the first opening and the at least a second opening are completely filled with the at least one conductive material.

14. The semiconductor component of claim 1, wherein the first opening and the at least a second opening are lined with at least one layer of conductive material.

15. The semiconductor component of claim 1, wherein the first opening and the at least a second opening are in cross-section and at least a point of the first sidewall is aligned with at least a point of the second sidewall.

16. The semiconductor component of claim 15, wherein a longitudinal axis of the first opening and a longitudinal axis of the at least a second opening are mutually parallel, and a line extending longitudinally along the first sidewall and a line extending longitudinally along the second sidewall are coincident.

17. The semiconductor component of claim 1, wherein a longitudinal axis of the first opening and a longitudinal axis of the at least a second opening are mutually parallel.

18. The semiconductor component of claim 17, wherein the longitudinal axis of the first opening and the longitudinal axis of the at least a second opening are laterally offset.

19. The semiconductor component of claim 1, wherein a longitudinal axis of the first opening and a longitudinal axis of the at least a second opening are laterally offset.

20. The semiconductor component of claim 1, wherein the first opening and the at least a second opening have respective longitudinal axes at an acute angle to one another.

21. The semiconductor component of claim 1, wherein the at least one conductive material comprises at least two conductive materials.

22. The semiconductor component of claim 21, wherein at least a portion of the at least a second opening is filled with aluminum.

23. The semiconductor component of claim 21, wherein at least a portion of the first opening is filled with at least one of copper and nickel.

24. The semiconductor component of claim 23, wherein a remainder of the first opening is filled with at least one of a solder paste, conductive nanoparticles in an organic carrier, a conductive polymer and a conductor-filled polymer.

25. The semiconductor component of claim 21, wherein at least a portion of the first opening is filled with at least one of a solder paste, conductive nanoparticles in an organic carrier, a conductive polymer and a conductor-filled polymer.

26. The semiconductor component of claim 1, wherein the at least one via comprises a plurality of vias, wherein second openings of at least some vias of the plurality of vias are disposed on a common linear path, and first openings of the at least some vias of the plurality of vias extend at least partially laterally to at least one side of the common linear path.

27. The semiconductor component of claim 1, wherein the first opening and the at least a second opening have differently shaped cross-sections.

28. The semiconductor component of claim 1, wherein the at least a second opening lies adjacent and in communication with a portion of the first sidewall of the first opening and outside an envelope thereof.

29. The semiconductor component of claim 1, wherein the at least one conductive material comprises a first, sputtered conductive material, a second, plated conductive material and a third conductive material comprising a solder alloy.

30. The semiconductor component of claim 29, wherein the first, sputtered conductive material comprises aluminum, the second, plated conductive material comprises nickel or copper, and the third conductive material comprises a reflowed solder paste.

31. A semiconductor die, comprising:
a semiconductor substrate having a first surface and an opposing, second surface;
active circuitry adjacent the opposing, second surface and a plurality of bond pads disposed thereon in communication with the active circuitry;
a plurality of vias extending from the first surface to undersides of at least some of the plurality of bond pads, wherein each via of the plurality of vias comprises:
a first opening of a first cross-sectional dimension in the first surface of the semiconductor substrate, wherein the first opening is defined by a first sidewall and a bottom surface;
a second opening of a second, different cross-sectional dimension extending below the bottom surface of the first opening and in communication therewith, wherein the second opening is defined by a second sidewall; and
at least one conductive material at least partially filling the first opening and the second opening and extending from the first surface to the undersides of the plurality of bond pads.

32. The semiconductor die of claim 31, further comprising discrete conductive elements disposed over ends of the first opening and operably coupled to the at least one conductive material.

33. A test interposer, comprising:
a substrate having a first surface and an opposing, second surface;
a plurality of vias extending from the first surface to the opposing, second surface, wherein each via of the plurality of vias comprises:
a first opening of a first cross-sectional dimension in the first surface of the substrate, wherein the first opening is defined by a first sidewall and a bottom surface;
a second opening in the opposing, second surface of the substrate and of a second, different cross-sectional dimension extending below the bottom surface of the first opening and in communication therewith and extending within the substrate to a location adjacent the opposing, second surface, wherein the second opening is defined by a second sidewall; and
at least one conductive material at least partially filling the first opening and the second opening and extending from the first surface to the opposing, second surface.

34. The test interposer of claim 33, further comprising contact structures disposed over the second opening in the opposing, second surface operably coupled to the at least one conductive material within vias of the plurality of vias.

35. A semiconductor die assembly, comprising:
a semiconductor substrate having a first surface and an opposing, second surface;
active circuitry adjacent the opposing, second surface and a plurality of bond pads disposed thereon in communication with the active circuitry;
a plurality of vias extending from the first surface to locations within the semiconductor substrate adjacent the active circuitry, wherein each via of the plurality of vias comprises:
a first opening of a first cross-sectional dimension in the first surface of the semiconductor substrate, wherein the first opening is defined by a first sidewall and a bottom surface;

a second opening of a second, different cross-sectional dimension in the opposing, second surface of the semiconductor substrate extending below the bottom surface of the first opening and in communication therewith, wherein the second opening is defined by a second sidewall; and at least one conductive material at least partially filling the first opening and the second opening and extending from the first surface to the opposing, second surface; and a heat sink operably coupled to the at least one conductive material adjacent the first surface of the semiconductor substrate.

36. A semiconductor die assembly, comprising:

an interposer substrate having a first surface and an opposing, second surface;

a plurality of contact pads disposed on the opposing, second surface;

a plurality of vias extending from the first surface to undersides of the plurality of contact pads, wherein each via of the plurality of vias comprises:

a first opening of a first cross-sectional dimension in the first surface of the interposer substrate, wherein the first opening is defined by a first sidewall and a bottom surface;

a second opening of a second, different cross-sectional dimension in the opposing, second surface of the interposer substrate extending to the underside of a contact pad of the plurality of contact pads, below the bottom surface of the first opening and in communication therewith, wherein the second opening is defined by a second sidewall; and at least one conductive material at least partially filling the first opening and the second opening and extending from the first surface to the underside of a contact pad of the plurality of contact pads; and a semiconductor die having bond pads operably coupled to the plurality of contact pads of the interposer substrate.

37. The semiconductor die assembly of claim 36, further comprising discrete conductive elements disposed over ends of the first opening and operably coupled to the at least one conductive material.

38. A semiconductor die assembly, comprising:

a first semiconductor die comprising a semiconductor substrate having a first surface and an opposing, second surface;

active circuitry adjacent the opposing, second surface and a plurality of bond pads disposed thereon in communication with the active circuitry;

a plurality of vias extending from the first surface to undersides of at least some of the plurality of bond pads, wherein each via of the plurality of vias comprises:

a first opening of a first cross-sectional dimension in the first surface of the semiconductor substrate, wherein the first opening is defined by a first sidewall and a bottom surface;

a second opening of a second, different cross-sectional dimension extending below the bottom surface of the first opening and in communication therewith, wherein the second opening is defined by a second sidewall; and at least one conductive material at least partially filling the first opening and the second opening and extending from the first surface to the undersides of the at least some of the plurality of bond pads; and a second semiconductor die having a plurality of bond pads on a surface thereof, wherein at least some of the plurality of bond pads of the second semiconductor die are operably coupled to the at least one conductive material at least partially filling the first opening and the second opening of at least some of the plurality of vias.

39. The semiconductor die assembly of claim 38, further comprising discrete conductive elements disposed over ends of the first opening and operably coupled to the at least one conductive material.

40. The semiconductor die assembly of claim 38, wherein the second semiconductor die is substantially identical to the first semiconductor die, and further comprising discrete conductive elements disposed over ends of a first opening of the second semiconductor die and operably coupled to the at least one conductive material therein.

41. An electronic system, comprising:

a microprocessor; and a memory component operably coupled with the microprocessor, the memory component comprising:

a semiconductor substrate having a first surface and an opposing, second surface;

active circuitry adjacent the opposing, second surface and a plurality of bond pads disposed thereon in communication with the active circuitry;

a plurality of vias extending from the first surface to undersides of at least some of the plurality of bond pads, wherein each via of the plurality of vias comprises:

a first opening of a first cross-sectional dimension in the first surface of the semiconductor substrate, wherein the first opening is defined by a first sidewall and a bottom surface;

a second opening of a second, different cross-sectional dimension extending below the bottom surface of the first opening and in communication therewith, wherein the second opening is defined by a second sidewall; and at least one conductive material at least partially filling the first opening and the second opening and extending from the first surface to the undersides of the at least some of the plurality of bond pads.

\* \* \* \* \*

UNITED STATES PATENT AND TRADEMARK OFFICE
CERTIFICATE OF CORRECTION

PATENT NO.        : 7,528,491 B2
APPLICATION NO.   : 11/516424
DATED             : May 5, 2009
INVENTOR(S)       : Kirby et al.

It is certified that error appears in the above-identified patent and that said Letters Patent is hereby corrected as shown below:

In column 14, line 56, in claim 10, after "with a portion of" insert -- at least one of --.

In column 15, lines 9-11, in claim 15, after "wherein" delete "the first opening and the at least a second opening are in cross-section and".

Signed and Sealed this

Twenty-eighth Day of July, 2009

JOHN DOLL
*Acting Director of the United States Patent and Trademark Office*